United States Patent
Mostafazadeh et al.

(10) Patent No.: US 6,589,814 B1
(45) Date of Patent: Jul. 8, 2003

(54) LEAD FRAME CHIP SCALE PACKAGE

(75) Inventors: Shahram Mostafazadeh, San Jose, CA (US); Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/399,585

(22) Filed: Sep. 20, 1999

Related U.S. Application Data (62) Division of application No. 09/054,422, filed on Apr. 2, 1998, now Pat. No. 6,130,473.

(51) Int. Cl.[7] .................. H01L 21/44; H01L 21/48; H01L 21/50; H01L 23/495
(52) U.S. Cl. .................. 438/112; 438/111; 438/113; 438/123; 438/124; 257/676
(58) Field of Search .................. 438/111, 112, 438/113, 123, 124; 257/666, 676

(56) References Cited

U.S. PATENT DOCUMENTS

| | | | |
|---|---|---|---|
| 3,657,805 A | 4/1972 | Johnson | 29/589 |
| 4,504,435 A * | 3/1985 | Orcutt | 264/272.17 |
| 4,672,418 A | 6/1987 | Moran et al. | 357/70 |
| 4,896,418 A * | 1/1990 | Yearsley | 29/827 |
| 4,899,207 A | 2/1990 | Hallowell et al. | 357/70 |
| 5,157,475 A | 10/1992 | Yamaguchi et al. | |
| 5,157,480 A | 10/1992 | McShane et al. | |
| 5,177,591 A | 1/1993 | Emanuel | 257/674 |
| 5,200,362 A | 4/1993 | Lin et al. | |
| 5,273,938 A | 12/1993 | Lin et al. | |
| 5,294,827 A | 3/1994 | McShane | 257/666 |
| 5,521,429 A | 5/1996 | Aono et al. | |
| 5,559,364 A | 9/1996 | Hojyo | 257/666 |
| 5,640,746 A * | 6/1997 | Knecht et al. | 29/25.35 |
| 5,656,550 A | 8/1997 | Tsuji et al. | |
| 5,663,593 A | 9/1997 | Mostafazadeh et al. | |
| 5,696,033 A * | 12/1997 | Kinsman | 437/217 |
| 5,844,315 A | 12/1998 | Melton et al. | |
| 5,973,388 A | 10/1999 | Chew et al. | |
| 6,117,710 A | 9/2000 | Mostafazadeh et al. | |
| 6,130,473 A | 10/2000 | Mostafazadeh et al. | |
| 6,143,981 A | 11/2000 | Glenn | |
| 6,190,938 B1 | 2/2001 | Liu | |
| 6,201,292 B1 | 3/2001 | Yagi et al. | |
| 6,215,179 B1 | 4/2001 | Ohgiyama | |
| 6,229,200 B1 * | 5/2001 | Mclellan et al. | 257/666 |

* cited by examiner

Primary Examiner—Carl Whitehead, Jr.
Assistant Examiner—Nema Berezny
(74) Attorney, Agent, or Firm—Beyer Weaver & Thomas, LLP (57) ABSTRACT

A method for producing chip scale IC packages includes the step of mounting a lead frame panel on a temporary support fixture in order to provide support and protection during the manufacturing process. An embodiment of the temporary support fixture includes a sheet of sticky tape secured to a rigid frame. The rigid frame maintains tension in the sheet of sticky tape to provide a stable surface to which the lead frame panel can be affixed. Installation of IC chips and encapsulation in protective casings is performed as in conventional IC package manufacturing. If encapsulant material is to be dispensed over the IC chips, an encapsulant dam can be formed around the lead frame panel to contain the flow of encapsulant material. The temporary support fixture can be used in any IC package manufacturing process in which lead frames require supplemental support.

23 Claims, 6 Drawing Sheets

191 SMALL OUTLINE PACKAGE (SOP)

FIG. 1d-2
(PRIOR ART)

192 PIN-THROUGH-HOLE (PTH)

FIG. 1d-3
(PRIOR ART)

191 PLASTIC LEADED CHIP CARRIER (PLCC)

LEAD FRAME CHIP SCALE PACKAGE

This is a division of application Ser. No. 09/054,422, filed Apr. 2, 1998 now U.S. Pat. No. 6,130,473, issued Oct. 10, 2000.

BACKGROUND INFORMATION

Field of the Invention

The present invention relates to integrated circuit packages, and more specifically, to the production of a chip scale integrated circuit package using a lead frame.

The use of a lead frame provides an inexpensive means for IC package manufacturing. Etching or stamping a sheet of thin metal to produce the desired lead frame patterns is a well-known manufacturing process, and is conducive to high-volume, low-cost production. In addition, the lead frame panel provides a support framework for the IC chips during IC package assembly. However, as IC chip device densities increase and IC package sizes decrease, the geometries used in the electrical communication paths between the IC chip and the PCB decrease. For example, a chip scale package requires that the protective casing be no more than 20% larger than the IC chip. As a result, the area available for the electrical paths provided by the lead frame is significantly reduced, demanding much finer lead frame patterns. In order to construct that finer geometry, the lead frame thickness must be reduced to a point where the lead frame panel rigidity would no longer be sufficient to provide the necessary support during the IC package assembly process. Also, the fragile lead frame patterns would be more susceptible to damage during the manufacturing process. As a result, chip scale IC packages must use more costly techniques such as tape automated bonding (TAB) or printed substrate backing.

Accordingly, it is desirable to provide an IC packaging method that allows the use of a lead frame in a chip scale package.

SUMMARY OF THE INVENTION

The present invention provides a method for producing chip scale IC packages using lead frames. A temporary support fixture provides support and stability to a thin lead frame panel having the fine geometries required for higher-density IC chip interfaces. An embodiment of the support fixture includes an adhesive pad made of one-sided sticky tape mounted to a rigid frame made of stainless steel, the rigid frame maintaining the adhesive pad in a fixed configuration providing a stable flat surface for support of the lead frame panel. Alternatively, the rigid frame and adhesive pad can be made of any materials compatible with the IC package manufacturing process and capable of supporting the lead frame panel through the manufacturing process. The adhesive pad can also be patterned to ease the manufacturing process. The rigid frame can include positioning features to assist in the alignment of the lead frame and adhesive pad. If encapsulant material is to be dispensed over the lead frame panel, a containment dam can be formed around the lead frame after it is installed on the adhesive pad, to provide a boundary for encapsulant material flow.

BRIEF DESCRIPTION OF THE DRAWINGS

FIGS. 1c-1 and 1c-2 show bottom and cross sectional views of a single lead frame BGA IC package;

FIGS. 1d-1 through 1d-3 show examples of common IC packages;

Use of the same reference number in different figures indicates similar or like elements.

DETAILED DESCRIPTION

Figure 1A:
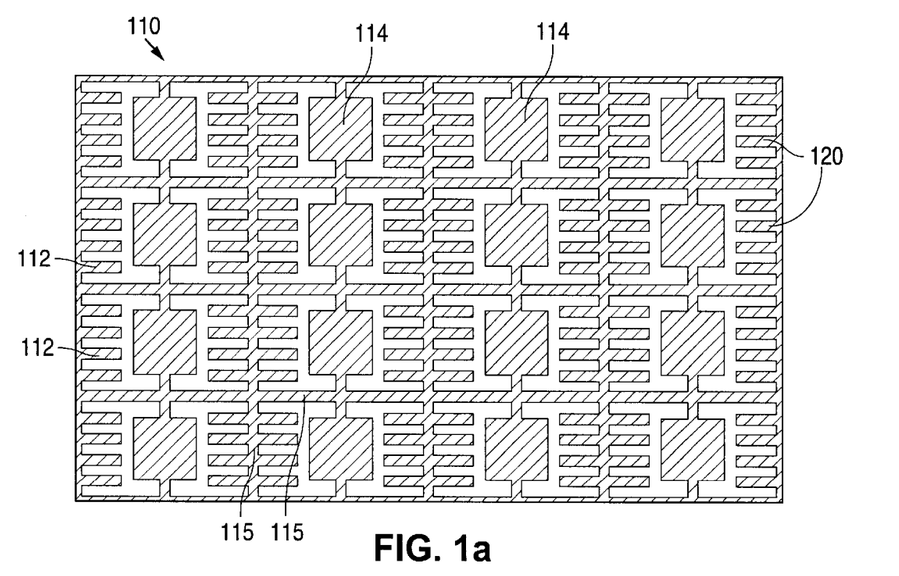
FIG. 1a shows a representation of a lead frame panel.
Figure 1B:
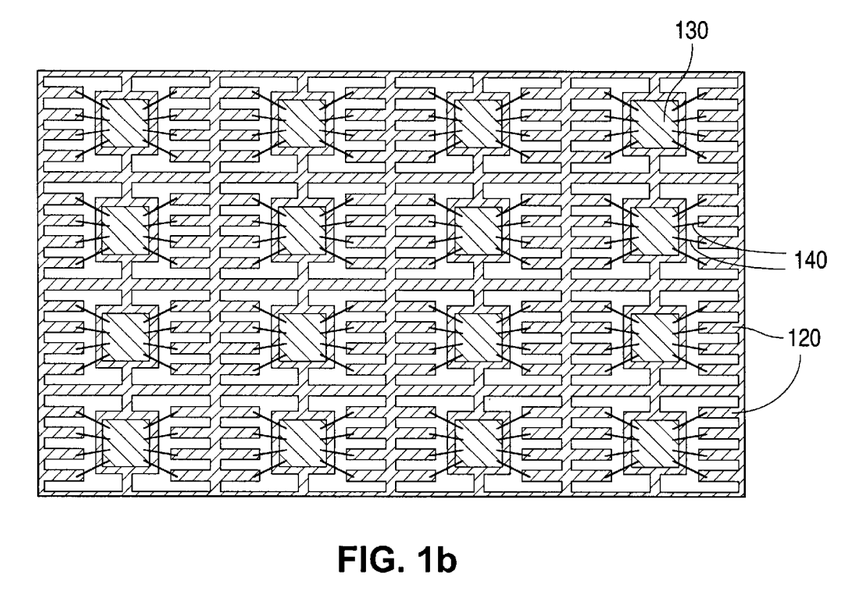
FIG. 1b shows a lead frame panel populated with IC chips.
Figure 1C:
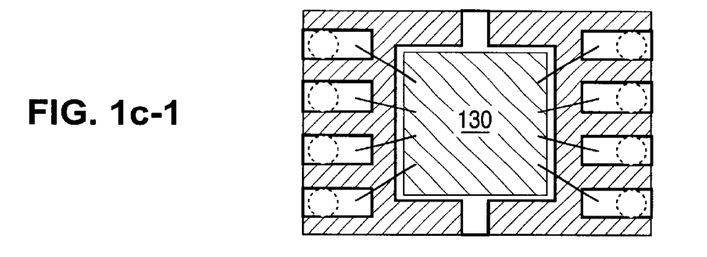
Figure 1C:
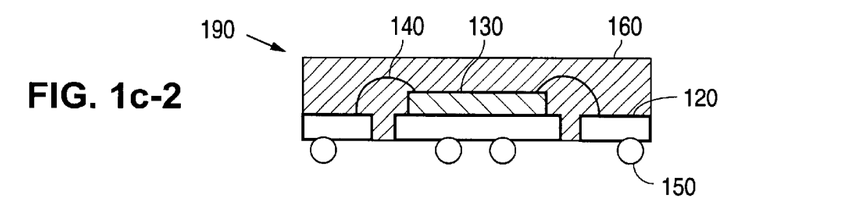
Figure 1D:
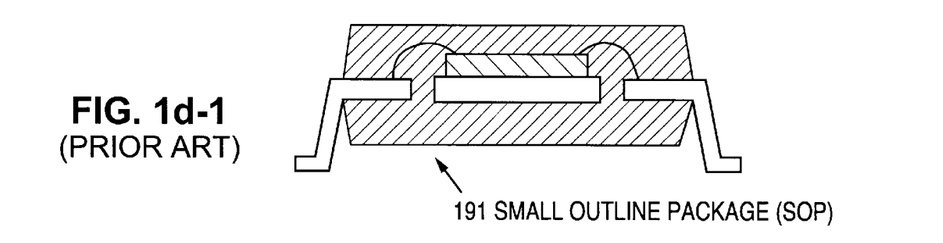
Figure 1D:
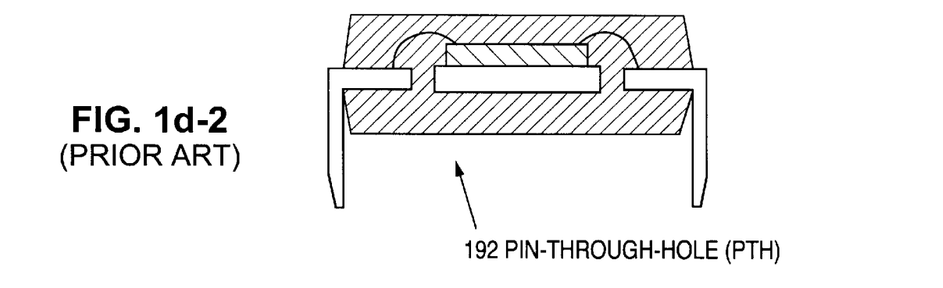
Figure 1D:
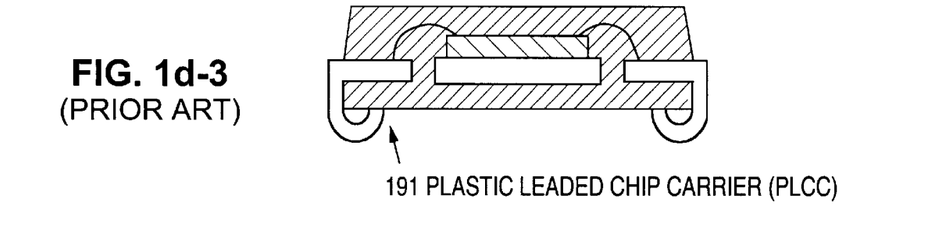
Figure 2A:
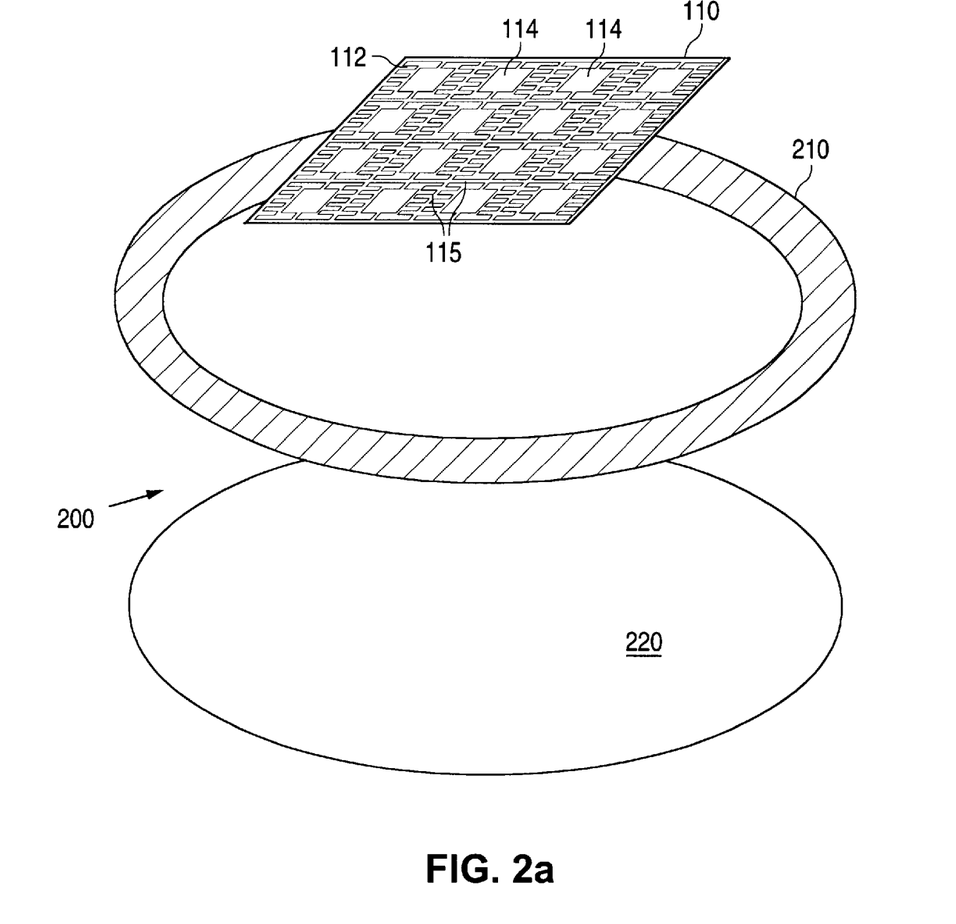
FIG. 2a shows an embodiment of a rigid support fixture.

A lead frame panel 110 suitable for use in accordance with the present invention is illustrated in FIG. 2. The lead roe panel 110 includes a two dimensional array of device areas. Each device area has a plurality of contacts 112 and a die attach pad 114. The panel has a grid of tie bars 115 that extend in perpendicular rows and columns to define the device areas. The tie bars 115 carry the contacts 112 and die attach pads 114. The lead frame panel 110 is typically etched or stamped from a thin sheet of metal. An IC chip 130 is then mounted and wire bonded to each lead frame 120. Wire bonding is typically performed Using fine gold wires 140.

Figure 2B:
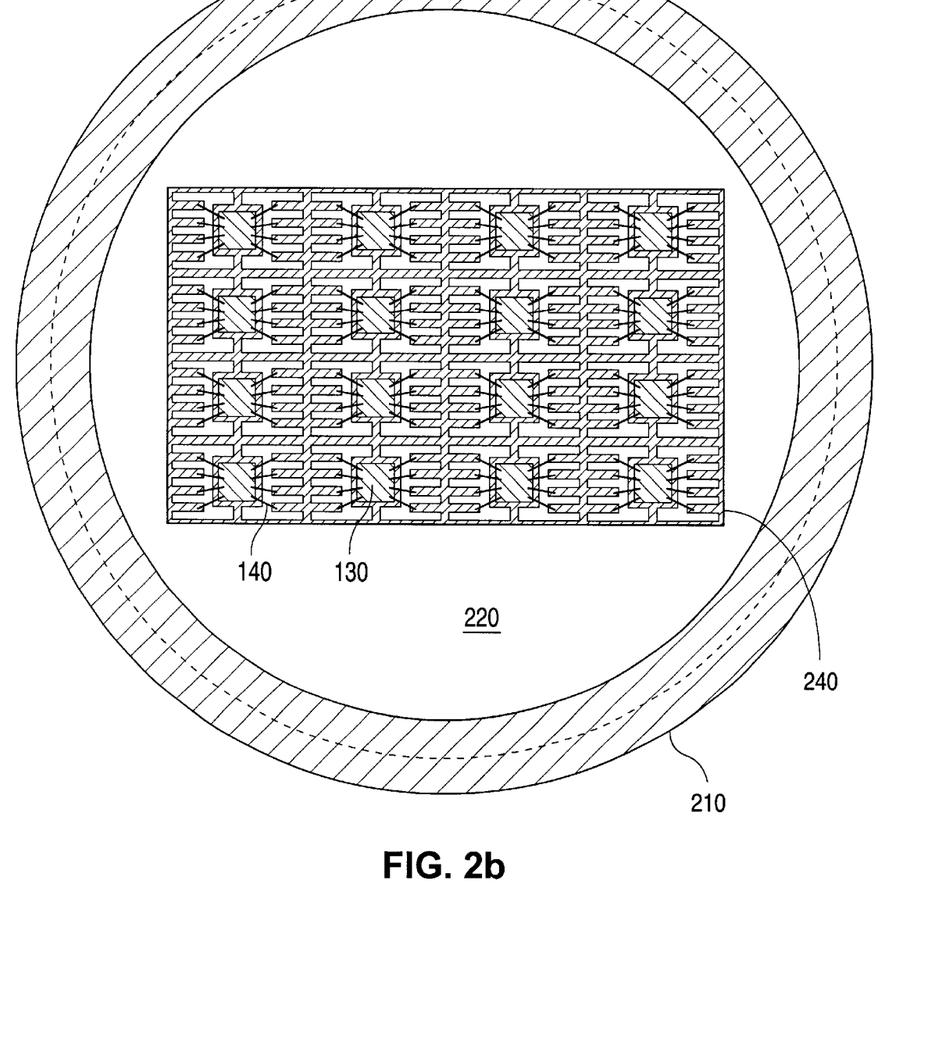
FIG. 2b shows a lead frame panel mounted on an embodiment of a support fixture.

The embodiment shown in FIG. 2a employs a rigid support fixture during the manufacturing process to enable the use of lead frames in chip scale IC packages. An embodiment of a support fixture 200 includes a rigid frame 210 and an adhesive pad 220, as shown in the exploded isometric diagram of FIG. 2a. Because pad 220 is affixed along its border to frame 210, it maintains sufficient tension to provide a stable supporting surface for a lead frame panel 110. By making pad 220 out of a thin, flexible, and electrically non-conductive material, it provides a support structure that will not interfere with the conventional manufacturing processes used in IC package assembly. The size of the interior opening of frame 210 is large enough to allow lead frame panel 110 to be fully supported by pad 220. Multiple IC chips 130 are then installed and wire bonded on lead frame panel 110, as shown in FIG. 2b. Subsequent encapsulation of IC chips 130 in protective casings proceeds as in conventional lead frame processing. If a molded protective casing is to be applied, an encapsulant dam 240 can be constructed around the perimeter of lead frame panel 110. Dam 240 can be made of any substantially rigid substance, including premolded plastic, epoxy, or tape, and serves to prevent flow of encapsulant material beyond the boundaries of lead frame panel 10. Alternatively, containing measures for encapsulant material could be incorporated into the dispensing mechanism. Once encapsulation is complete, support fixture 200 can be removed, either before or after singulation.

The embodiment of the present invention shown in FIGS. 2a and 2b can be constructed from common and readily available materials. Pad 220 can be made from a 3M or Nitto-brand sticky tape used in conventional wafer saw operations. Likewise, a stainless steel ring of the type used in conventional wafer saw operations can be employed for frame 210. However, both pad 220 and frame 210 can be implemented in many different ways as well. For example, frame 210 can be constructed from any rigid material compatible with the IC package assembly process, such as copper, aluminum, or even non-metals such as ceramic or plastic. Also, while depicted as a thin circular element, frame 210 can also take a variety of configurations depending on handling, interface, and user requirements. For instance, frame 210 can include positioning features to ensure consistent alignment for lead frame panel 110 and adhesive pad 220. A circular outline for frame 210 provides compatibility with conventional handling requirements for IC production, but is not a required aspect of the present invention.

Similarly, numerous implementations of adhesive pad 220 are possible. Any material compatible with the IC package assembly process and capable of providing the necessary support to the lead frame panel and IC chips can be used. The sticky tape mentioned previously is a convenient choice due to widespread current usage and availability. The use of one-sided sticky tape enables pad 220 to be applied to the bottom surface of frame 210 and provide an adhesive surface for mounting of lead frame panel 110, without requiring additional attachment materials or components. Pad 220 can also be patterned by removing selected portions in order to facilitate subsequent assembly operations such as electrical interconnection formation. Removal of pad 220 once packaging is complete can be performed in various ways, depending on the nature of the adhesive material used. A light adhesive material may allow pad 220 to simply be peeled away from frame 110. An alternative bonding agent requires exposure to UV light before removal of pad 220 can take place.

Figure 3A:
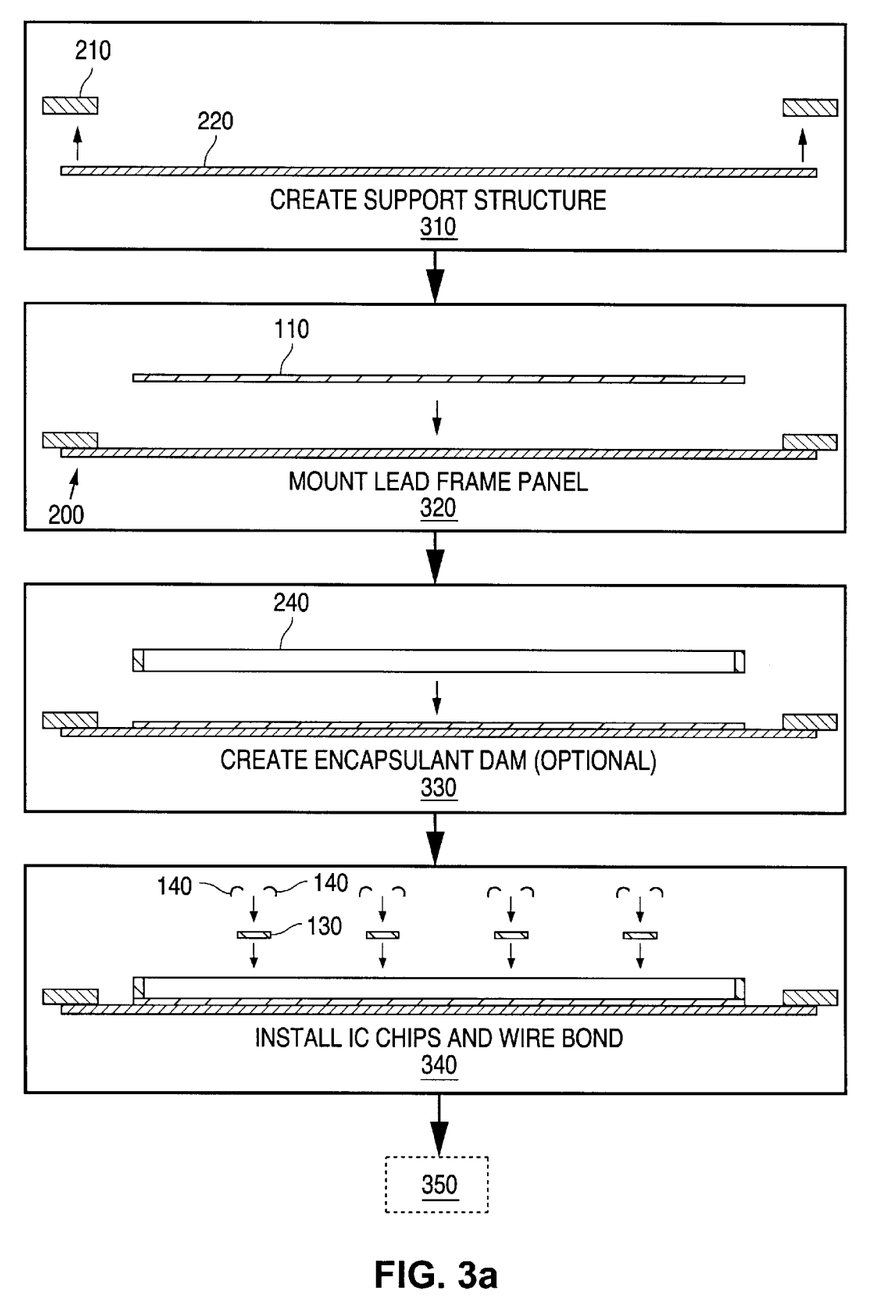
FIGS. 3a and 3b show a flow diagram of a manufacturing process using a temporary support fixture.
Figure 3B:
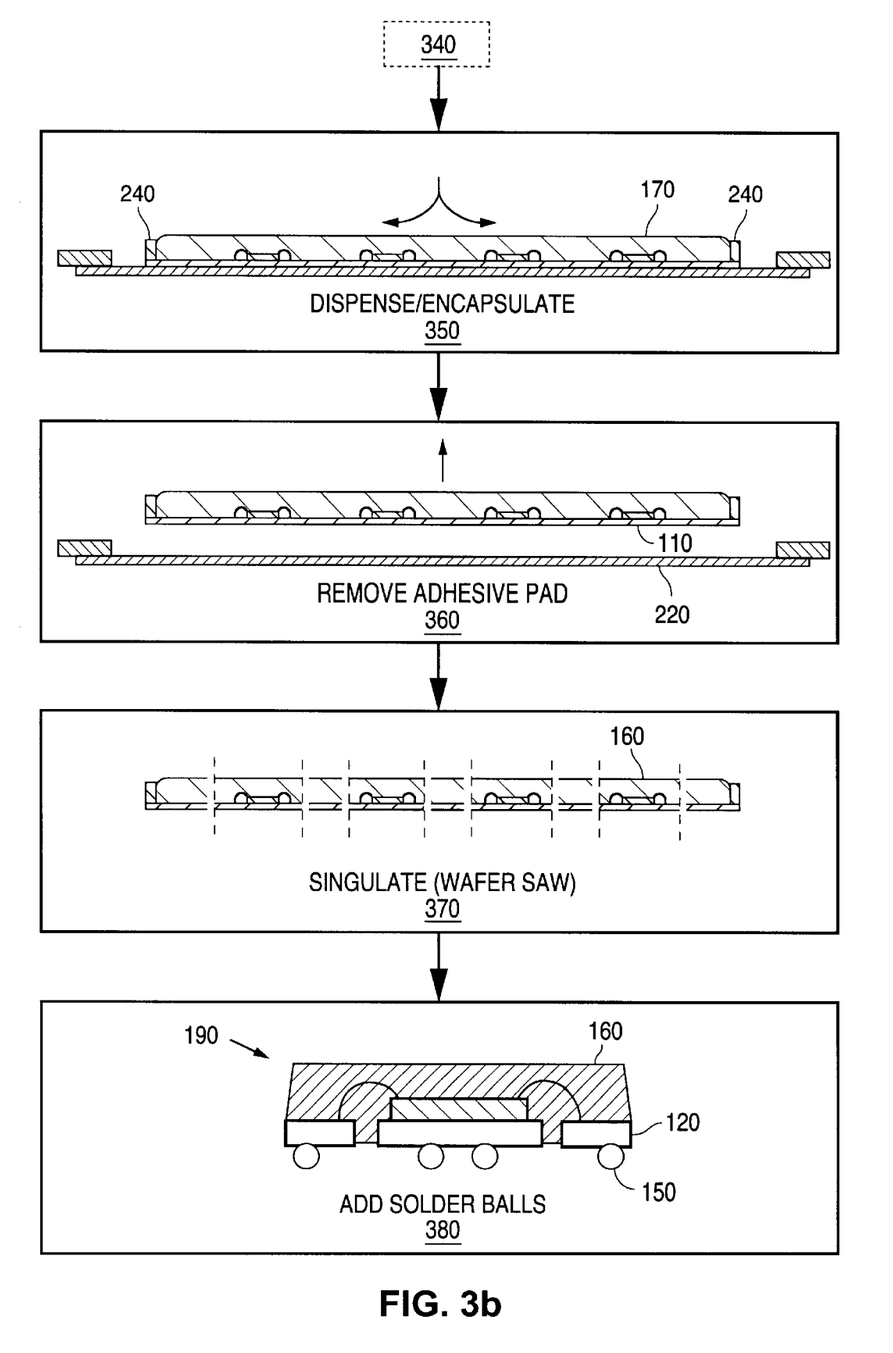

FIGS. 3a and 3b show a graphical flow chart illustrating a method for manufacturing a lead frame BGA package using an embodiment of the present invention. The manufacturing process is described in conjunction with the elements described in FIGS. 2a–2c. In a step 310 in FIG. 3a, adhesive pad 220 is applied to rigid frame 210 to create support fixture 200. Lead frame panel 110 is then mounted on pad 220 in a step 320. An optional step 330 allows encapsulant dam 240 to be applied around the border of lead frame panel 110 if subsequent encapsulant material dispensing is to be performed. Next, an IC chip 130 is mounted and wire bonded onto each of the lead frames 120 of lead frame panel 110. Continuing the process in FIG. 3b, a step 350 involves dispensing a portion of encapsulant material 170 into the area defined by dam 240 to cover IC chips 130, and then curing material 170 to a desired hardness. In a step 360, pad 220 is removed from lead frame panel 110. Next, in a step 370, a wafer saw operation is performed to singulate lead frame panel 110 into individual IC packages. The singulation process converts the layer of hardened encapsulant material 170 into individual protective casings 160. Finally, in a step 380, solder balls 150 are applied to desired electrical interconnection locations to complete lead frame BGA IC package 190.

In this manner a lead frame BGA IC package can be produced using a temporary support structure. This enables the production of IC packages using lead frames that would otherwise be too fragile to withstand conventional manufacturing processes. It should be noted that while particular embodiments of the present invention have been shown and described, it will be apparent to those skilled in the art that many modifications and variations thereto are possible, all of which fall within the true spirit and scope of the invention. For example, the wafer saw operation of step 370 can be performed prior to removal of support fixture 200 from lead frame panel 110. Also, solder balls 150 could be applied to lead frames 120 in step 370 prior to singulation. Alternatively, appropriately located openings in adhesive pad 220 would allow solder balls 150 to be applied without removing pad 220. Certain lead frame designs may even allow patterning of pad 220 such that removal is unnecessary. Finally, while the present invention has been described with reference to chip scale IC package manufacturing, it can be applied to any IC package manufacturing process involving lead frames, including non-chip scale and non-BGA IC packages such as SOP's, PLCC's, and PTH packages.

We claim:

1. A method of IC package production comprising the steps of:

creating a plurality of lead frames joined into a single lead frame panel;

attaching said lead frame panel to a removable support;

installing a plurality of semiconductor dies onto said plurality of lead frames;

encapsulating said plurality of semiconductor dies in a protective casing with the removable support attached to the lead frame panel, wherein molding material used to encapsulate the plurality of semiconductor dies covers exposed surfaces of the lead frames and contacts the removable support in gaps between lead frame components, whereby the protective casing covers a multiplicity of device areas such that the covered device areas are not individually encapsulated; and singulating said plurality of lead frames after the encapsulation.

2. The method of claim 1 wherein said singulating step comprises the steps of:

removing said removable support from said plurality of lead frames;

cutting said lead frame panel into a plurality of packaged integrated circuits.

3. The method of claim 1 wherein said attaching step comprises the steps of:

mounting an adhesive pad on a rigid frame such that said adhesive pad forms a taut surface across an interior opening of said rigid frame, said interior opening being larger than the border of said lead frame panel; and mounting said lead frame panel on said adhesive pad such that said lead frame panel is completely within said interior opening.

4. The method of claim 3 wherein said adhesive pad is constructed of single-sided sticky tape and is affixed around its border to said rigid frame.

5. A method of forming a lead frame panel suitable for use in semiconductor packaging, the method comprising:

patterning a conductive sheet to form a lead frame panel having at least one two dimensional array of immediately adjacent device areas defined thereon with a matrix of tie bars that extend in substantially perpendicular rows and columns to define the two dimensional array, wherein adjacent device areas in the two dimensional array are separated only by a single one of the tie bars, each device area being suitable for use in an independent integrated circuit package; and wherein the patterning forms a die attach pad and a plurality of contacts in each device area, with the contacts positioned generally about the die attach pad, the contacts being mechanically carried by the tie bars.

6. A method as recited in claim 5 further comprising adhering an adhesive pad to a bottom surface of the lead frame panel.

7. A method as recited in claim 5 wherein the die attach pads, the contacts and the tie bars are all patterned such that they are substantially co-planar.

8. A method for packaging a semiconductor device, the method comprising:

forming a lead frame panel as recited in claim 5;

mounting a plurality of dice on the lead frame panel, wherein each die is mounted on an associated die attach pad; and forming a protective cap over the two dimensional array of device areas to encapsulate the dice, wherein encapsulation material used to form the protective cap covers the dice and fills spaces between the die attach pads and their associated contacts such that a lower surface of the lead frame panel has exposed contacts and die attach pads that are substantially co-planar with exposed portions of the encapsulation material.

9. A method as recited in claim 8 herein the protective cap is molded over the two dimensional array of device areas and the molded protective cap uniformly covers the device areas, whereby the protective cap covers a multiplicity of device areas such that the covered device areas are not individually encapsulated.

10. A method as recited in claim 8 further comprising singulating the device areas by sawing to form a multiplicity of independent surface mountable integrated circuit packages.

11. A method of packaging integrated circuit devices, the method comprising:

patterning a conductive sheet to form a lead frame panel having a two dimensional array of adjacent device areas defined thereon that are arranged in substantially perpendicular rows and columns to define the two dimensional array, each device area being suitable for use in an independent integrated circuit package, wherein the patterning forms a plurality of contacts in each device area;

mounting a plurality of dice on the lead frame panel; and forming a protective cap over the two dimensional array of device areas to encapsulate the dice, wherein encapsulation material used to form the protective cap covers the dice and fills spaces between the contacts within each device area such that a lower surface of the lead frame panel has exposed contacts that are substantially co-planar with exposed portions of the encapsulation material, whereby the protective cap covers a multiplicity of device areas such that the covered device areas are not individually encapsulated.

12. A method as recited in claim 11 wherein the protective cap is molded over the two dimensional array of device areas and the molded protective cap uniformly covers the device areas.

13. A method as recited in claim 12 further comprising singulating the device areas by sawing to form a multiplicity of independent surface mountable integrated circuit packages.

14. A method as recited in claim 11 wherein:

each device area in the lead frame panel is patterned to further include a die attach pad; and bottom surfaces of the die attach pads are also exposed and are substantially co-planar with exposed portions of the encapsulation material.

15. A panel assembly as recited in claim 14 wherein the contacts and the die attach pads are patterned such that they have substantially the same thickness.

16. A method as recited in claim 11 further comprising adhering an adhesive pad to a bottom surface of the lead frame panel prior to the formation of the protective cap, whereby the adhesive pad serves to keep the encapsulation material exposed at the bottom of the panel assembly substantially co-planar with the bottom surfaces of the contacts.

17. A method as recited in claim 11 further comprising wire bonding conductive wires between electrically coupling the dice to their associated contacts, wherein the molded cap encapsulates the bonding wires.

18. A method as recited in claim 11 wherein adjacent device areas in the two dimensional array are separated only by a single tie bar.

19. A method of packaging semiconductor devices, the method comprising:

patterning a conductive sheet to form a lead frame panel having a two dimensional array of adjacent device areas wherein the patterning forms a plurality of contacts in each device area;

mounting a plurality of dice on the lead frame panel;

forming a protective cap over the two dimensional array of device areas to encapsulate the dice, wherein encapsulation material used to form the protective cap covers the dice and fills spaces between the contacts within each device area such that a lower surface of the lead frame panel has exposed contacts that are substantially co-planar with exposed portions of the encapsulation material, whereby the protective cap covers a multiplicity of device areas such that the covered device areas are not individually encapsulated; and adhering an adhesive pad to a bottom surface of the lead frame panel prior to the formation of the protective cap, whereby the adhesive pad serves to keep the encapsulation material that is exposed at the bottom of the panel assembly substantially co-planar with the bottom surfaces of the contacts.

20. A method as recited in claims 19 further comprising singulating the device areas by sawing to form a multiplicity of independently packaged surface mountable integrated circuit devices.

21. A method as recited in claim 19 wherein the protective cap is molded over the two dimensional array of device areas and the molded protective cap uniformly covers the device areas.

22. A method as recited in claim 19 wherein:

each device area in the lead frame panel is patterned to further include a die attach pad; and bottom surfaces of the die attach pads are also exposed are substantially co-planar with exposed portions of the encapsulation material.

23. A method as recited in claim 19 wherein adjacent device areas in the two dimensional array are separated only by a single tie bar.

* * * * *

UNITED STATES PATENT AND TRADEMARK OFFICE
CERTIFICATE OF CORRECTION

PATENT NO. : 6,589,814 B1
DATED : July 8, 2003
INVENTOR(S) : Mostafazadeh et al.

It is certified that error appears in the above-identified patent and that said Letters Patent is hereby corrected as shown below:

Column 2,
Line 16, change "roe" to -- frame --.
Line 25, change "Using" to -- using --.
Line 49, change "panel 10" to -- panel 110 --.

Column 5,
Line 12, change "herein" to -- wherein --.

Column 6,
Line 41, change "claims" to -- claim --.

Signed and Sealed this

Twenty-second Day of June, 2004

JON W. DUDAS
*Acting Director of the United States Patent and Trademark Office*